United States Patent [19]
Fukunaga

[11] Patent Number: 5,669,780
[45] Date of Patent: Sep. 23, 1997

[54] IC SOCKET

[75] Inventor: Masami Fukunaga, Kawaguchi, Japan

[73] Assignee: Enplas Corporation, Kawaguchi, Japan

[21] Appl. No.: 623,706

[22] Filed: Mar. 29, 1996

[30] Foreign Application Priority Data

Mar. 30, 1995 [JP] Japan ................................ 7-074010

[51] Int. Cl.$^6$ ........................................ H01R 11/22
[52] U.S. Cl. ................................ 439/266; 439/342
[58] Field of Search ........................ 439/265–268, 439/330, 331, 342, 68, 72, 71, 73

[56] References Cited

U.S. PATENT DOCUMENTS

| | | |
|---|---|---|
| 4,618,199 | 10/1986 | Pfaff. |
| 5,186,642 | 2/1993 | Matsuoka et al.. |
| 5,431,579 | 7/1995 | Kishi et al. ........................ 439/266 |
| 5,508,628 | 4/1996 | Pfaff ........................ 439/266 X |

*Primary Examiner*—Khiem Nguyen
*Attorney, Agent, or Firm*—Cushman, Darby & Cushman IP Group of Pillsbury Madison & Sutro LLP

[57] ABSTRACT

An IC socket comprises a socket body, a cover urged upward, stage means for mounting an IC device, a slide plate urged downward for actuating contact pins, and two slide bars each of which is pivotably mounted, in one end region thereof, to the cover and has a pushing portion and a shaft in another end region thereof. With respect to each of the slide bars, the pushing portion abuts on a protruding portion of the slide plate and the shaft slidably abuts on a concave portion of a guide. When the cover is pushed down, the shafts open rightward and leftward at the bottom, to cause the pushing portions to push up the slide plate. As the shaft approaches a position under the protruding portion, reaction against the cover is reduced. In this manner, the IC socket is enabled to stay increase in resistance against the pushing-down operation of the cover.

8 Claims, 16 Drawing Sheets

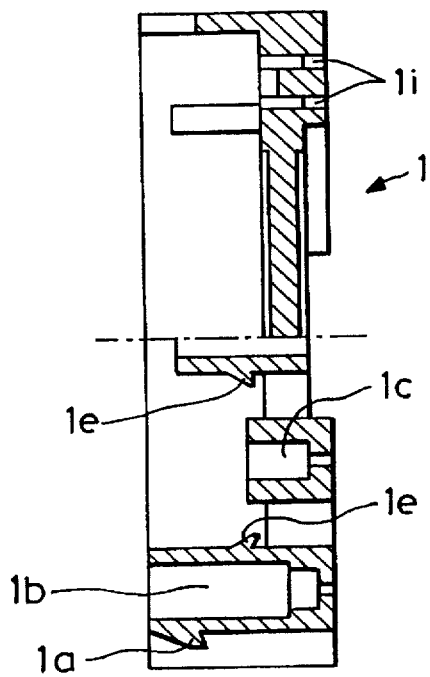
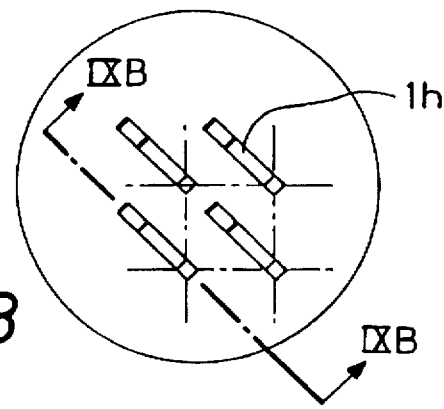
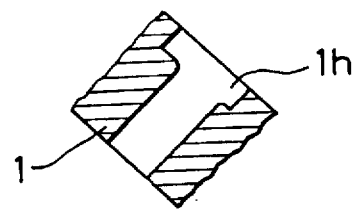
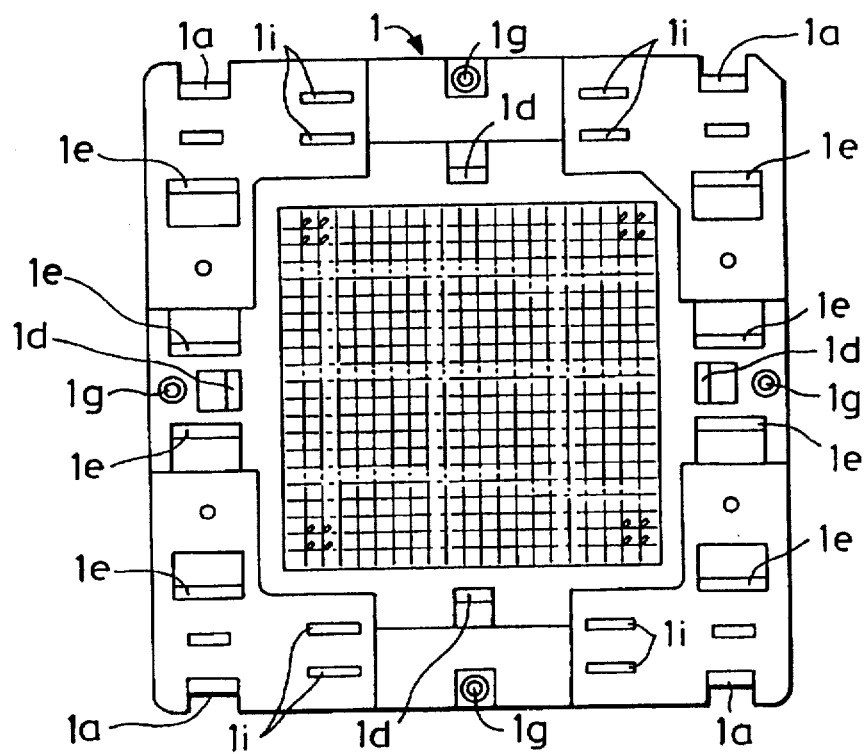

IC SOCKET

BACKGROUND OF THE INVENTION a) Field of the invention

The present invention relates to IC sockets which are used for inspection of IC devices packaging IC, LSI etc. or used as built-in devices for electric apparatus.

b) Description of the prior art

Some of these IC sockets are provided with a substantially square-shaped cover member in which an opening is formed as an entrance for an IC device, allow insertion of the IC device with the cover member being pushed down by some mechanism, and bring their contact pins into contact with lead terminals of the IC device by releasing the cover member from the pushing-down operation; such IC sockets are denominated "open-top type". IC sockets of this type are often constructed such that the contact pins get withdrawn from the insertion path of the IC device during downward movement of the cover member and then come into contact with the lead terminals from upside of the lead terminals during upward movement of the cover member. Although applicable to an IC device having lead terminals arranged on lateral sides of the IC chip, such an IC socket is not applicable to one having lead terminals arranged on the bottom of the IC chip.

Conventionally known as an IC socket applicable to the latter IC device is one which has a slide plate arranged, at a level lower than the mount position of the IC device, to be displaceable in horizontal or vertical directions in accordance with the vertical movement of the cover member, thereby the contact pins getting contacted with/separated from the lead terminals.

In the case of an IC socket having a vertically movable slide plate, the cover member is urged upward by springs, and the slide plate is urged downward by another springs. Therefore, as the cover member is pushed down to cause the slide plate to be shifted upward, these springs are further stressed to increase resistance against the pushing-down operation. Consequently, pushing force for moving down the cover member has to be designed strong, thus the mechanism for this operation is inevitably limited to high-performance and expensive one.

SUMMARY OF THE INVENTION

An object of the present invention is to provide an IC socket having a slide member which is displaced upward against force from springs via pushing-down operation of a cover member, wherein the IC socket has a simple structure and allows the resistance against the pushing-down operation to be less increased during proceeding of the pushing-down operation.

In order to attain the above mentioned object, an IC socket according to the present invention comprises: a cover member assuming a square shape with an opening formed therein as an entrance for an IC device, being mounted to a socket body to be vertically displaceable relative thereto, and being urged upward; a stage member for mounting the IC device thereon; a slide plate having force receiving portions, being mounted to the socket body to be vertically displaceable relative thereto for actuating a plurality of contact pins, and being urged downward; and at least one each slide bar arranged, on each of mutually opposite sides of the square shape, such that one end region thereof is pivotably mounted to the cover member and the other end region thereof forms a pushing portion engageable with each of the force receiving portions of the slide plate; wherein the other end region of each slide bar is horizontally shifted along a guide portion provided on the socket body in accordance with vertical displacement of the cover member to displace the slide plate vertically via the pushing portion.

Also in an IC socket according to the present invention, it is preferred that the other end region of each slide bar is provided with a shaft to abut on the guide portion, and that an end face of the other end region of the slide bar acts as the pushing portion.

Furthermore, in an IC socket according to the present invention, it is preferred that two slide bars are arranged to form an X shape as one set on each of the mutually opposite sides of the square shape.

These and other objects as well as features and advantages of the present invention will become apparent in the following description of the preferred embodiment when taken in conjunction with the accompanying drawings.

BRIEF DESCRIPTION OF THE DRAWINGS

FIG. 7 is a sectional view taken along the line VII—VII of FIG. 5;

FIG. 8 is a bottom plan view of the socket body shown in FIG. 5;

FIG. 9A is an enlarged view of the circled part indicated by the arrow A of FIG. 5;

FIG. 9B is a sectional view taken along the line IX—IX of FIG. 9A;

DESCRIPTION OF THE PREFERRED EMBODIMENT

Figure 1A:
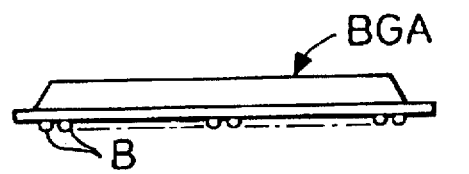
FIG. 1A is a side view of a BGA device applied to an IC socket according to the present invention.
Figure 1B:
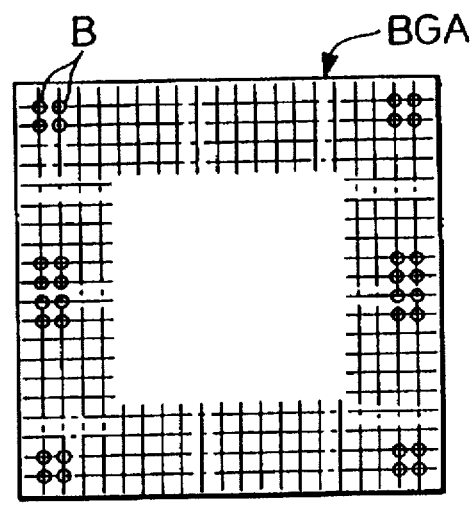
FIG. 1B is a bottom plan view of the device shown in FIG. 1A.

An embodiment will be presented as a so-called open-top-type IC socket, which is specifically used for inspection of IC devices denominated "Ball Grid Array" (hereinafter referred to BGA) devices. FIGS. 1A, 1B show one example of such BGA devices. On the bottom surface of it, as well known, a plurality of spherical solder balls having approximately 0.75 mm diameter are arranged as lead terminals.

Figure 2:
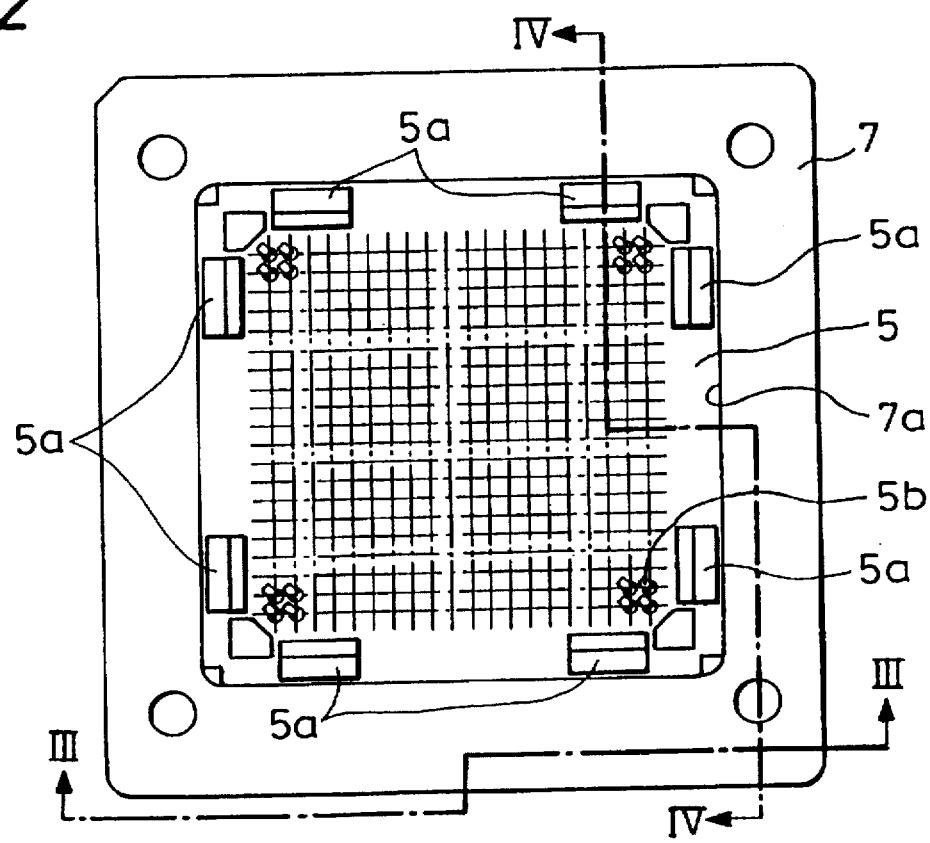
FIG. 2 is a plan view of an IC socket according to an embodiment of the present invention.
Figure 3:
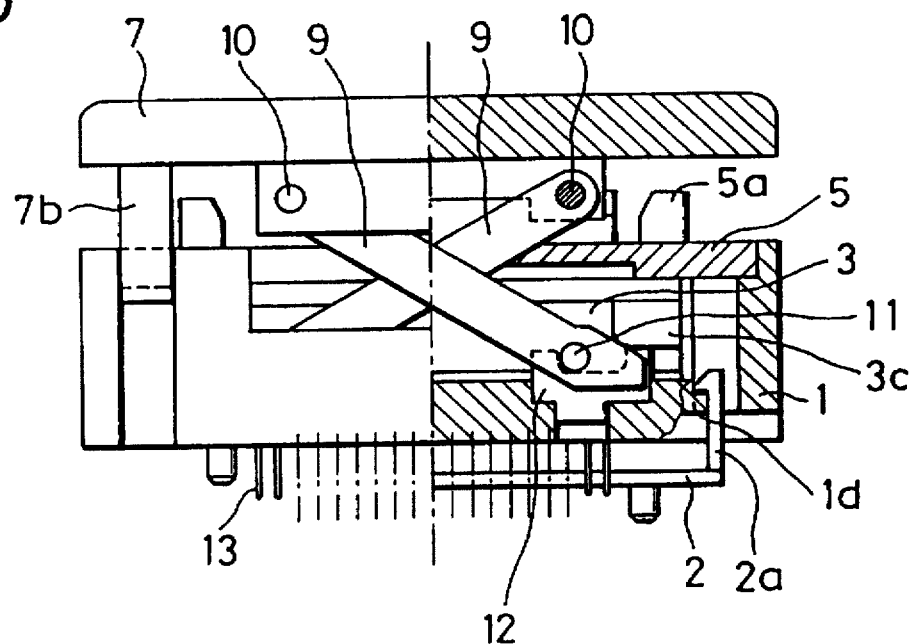
FIG. 3 is a sectional view taken along the line III—III of FIG. 2.
Figure 4:
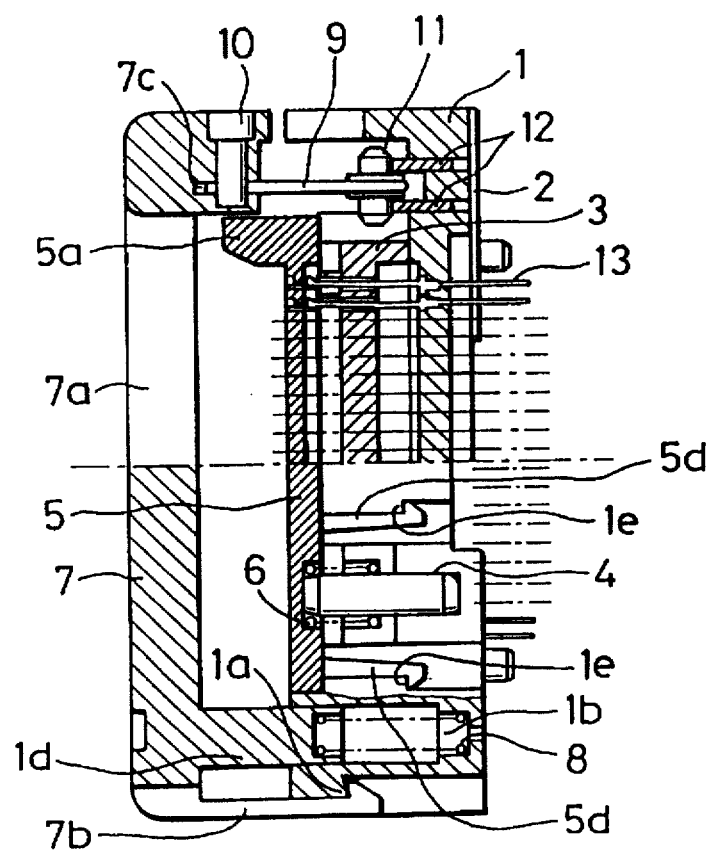
FIG. 4 is a sectional view taken along the line IV—IV of FIG. 2.

Firstly, the overall construction of the embodiment will be described using FIG. 2 through FIG. 4. On a bottom side of a socket body 1, a locate board 2 is vertically movably mounted as shown in FIG. 3. The locate board 2 facilitates, as well known, location of contact pins when the IC socket is mounted on a printed circuit board. FIG. 3 shows the locate board 2 as spaced from the socket body 1, and FIG. 4 shows it as situated at its proximate position with respect to the the socket body 1.

On a top side of the socket body 1, a slide plate 3 is arranged. The slide plate 3 is vertically displaceable relative to the socket body 1 as guided by four reference pins a each of which is inserted, at one end thereof, in the socket body 1. Over the slide plate 3 a top plate 5 is arranged. The top plate 5 is mounted to the socket body, with four receiver holes being formed thereon for inserting the other ends of the four reference pins 4. Around the reference pins 4, coil springs 6 are wound, to push the slide plate 3, in reference to the top plate 5, in a direction toward the socket body 1, i.e. downward direction of FIG. 3. Also, on the upper surface of the top plate 5, eight guides 5a are formed as apparently seen in FIG. 2. Each of the guides 5a has a face inclined toward the center of the IC socket shown in FIG. 2, to guide a BGA device to be correctly positioned on the upper surface of the top plate 5.

Over the top plate 5, a cover 7 is arranged. The cover 7 has an opening 7a formed to allow loading of the BGA device to the IC socket from upside. In the state shown in FIGS. 3, 4, the cover 7 is being pushed upward by coil springs 8 (see FIG. 4) arranged between the cover 7 and the socket body 1 at positions in four corner regions of the IC socket, but is kept at its upper limit position by engagement of elastic hook portions 7b formed at positions in four corner regions of the cover 7 with hook portions 1a of the socket body 1. Every one of the socket body 1, the locate board 2, the slide plate 3, the top plate 5 and the cover 7 is made of synthetic resin.

Two slide bars 9 arranged to form an X shape are mounted to the cover 7 as shown in FIG. 3, and another set of such slide bars 9 are arranged on the opposite side to form symmetry together with the former set of slide bars 9. As shown in FIG. 4, one end region of each of the slide bars 9 is pivotably mounted on the pin 10 as inserted in a slit 7c of the cover 7. In the other end region of each slide bar 9, there is provided a shaft 11, which is caused to slide on a slide support member 12 in right and left directions of FIG. 3 as the cover 7 moves in upward and downward directions. Detailed structure and function relating to this operation will be described later.

A plurality of contact pins 13 are fixed to the socket body 1 by thrusting. Connecting terminals of the contact pins 13 protrudingly appear on the bottom side of the socket body 1 to pass through the locate board 2 via a plurality of holes arranged therein, while contact pieces of the contact pins 13 appearing on the top side of the socket body 1 have elasticity and pass through a plurality of holes arranged in the slide plate 3, with their tips inserted in a plurality of holes 5b arranged in the top plate 5. Shapes of the contact pins 13, and shapes of these holes in the locate board 2, slide plate B and the top plate 5 will be detailed later.

Now, detailed description will be made on structure of each component.

Figure 5:
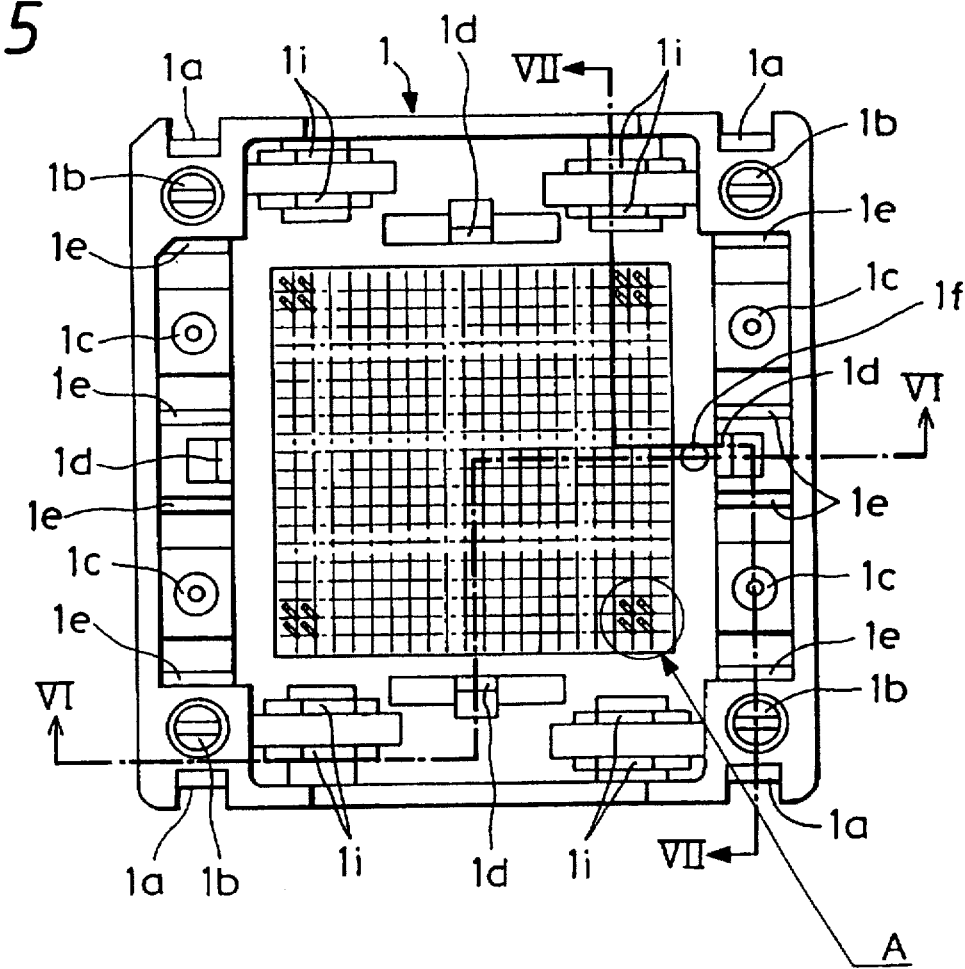
FIG. 5 is a plan view of a socket body of the IC socket shown in FIG. 2.

Firstly, the socket body 1 is described using FIG. 5 through FIG. 9. As shown in FIG. 5 and FIG. 8, the above-mentioned hook portions 1a are formed on the socket body 1 at positions in four corner regions thereof. In the four corner regions also, cylindrical holes 1b to accommodate the above-mentioned coil springs 8 are formed. Also, formed at four positions are cylindrical holes 1c, in each of which one end of each of the above-mentioned reference pins 4 is to be inserted. Furthermore, on the top side surface of the socket body 1, four hook portions 1d, eight hook portions 1e and one pin 1f are formed, while on the bottom side surface of the socket body 1, four pins 1g are formed to be used for locating the IC socket on the printed circuit board. Furthermore, for fixing the contact pins 13, the socket body 1 forms a plurality of through holes 1h as slots extending in a diagonal direction of the socket body 1 as shown in FIG. 9A. The socket body 1 further forms, at each of four positions therein, a pair of parallel through slots 1i for thrusting the slide support member 12 thereinto.

Figure 6:
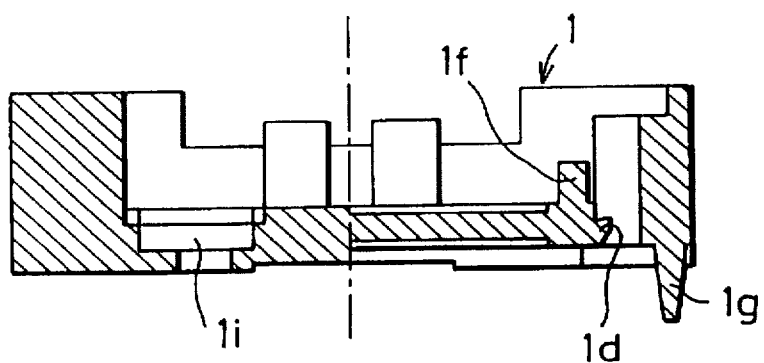
FIG. 6 is a sectional view taken along the line VI—VI of FIG. 5.
Figure 10A:
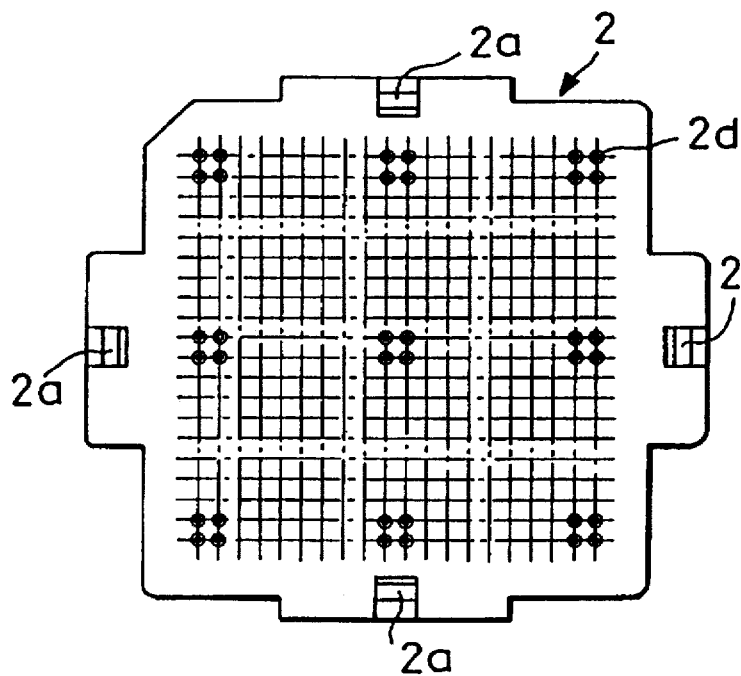
FIG. 10A is a plan view of a locate board incorporated into the IC socket shown in FIG. 2.
Figure 10B:
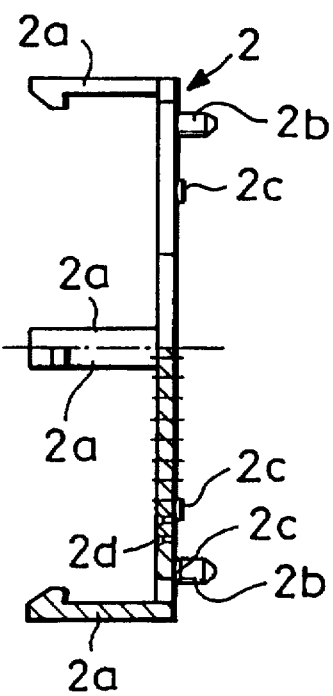
FIG. 10B is a partially sectioned right-side view of the locate board shown in FIG. 10A.
Figure 10C:
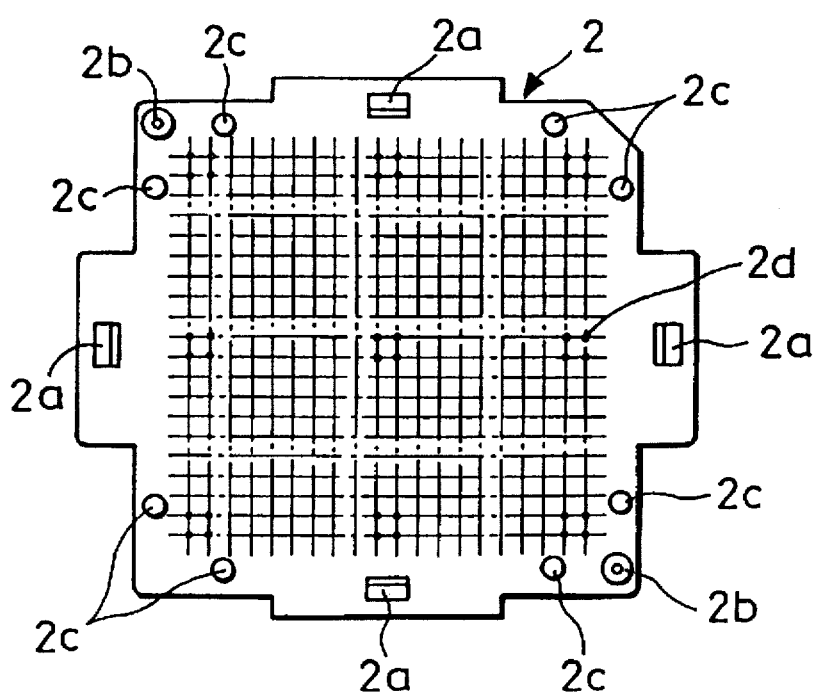
FIG. 10C is a bottom plan view of the locate board shown in FIG. 10A.
Figure 11A:
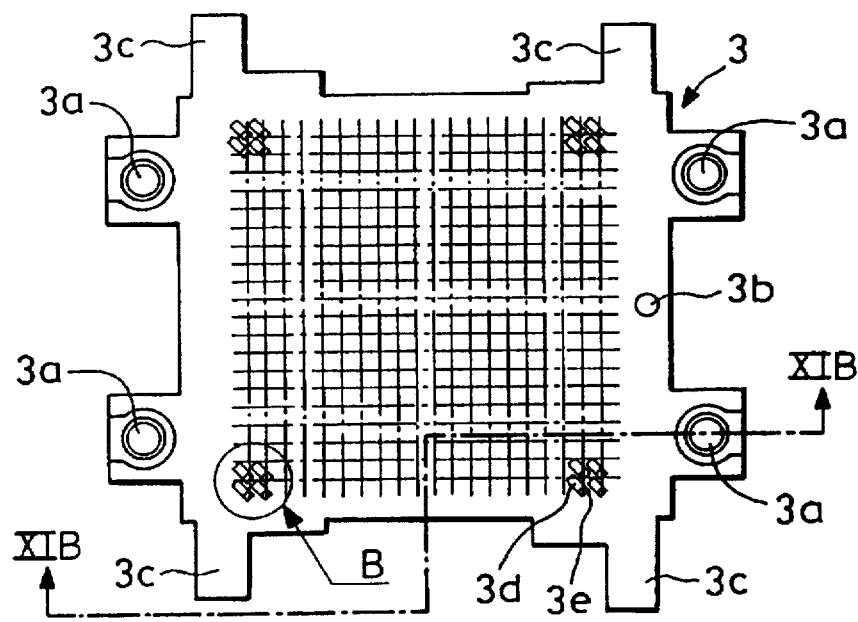
FIG. 11A is a plan view of a slide plate incorporated into the IC socket shown in FIG. 2.
Figure 11B:
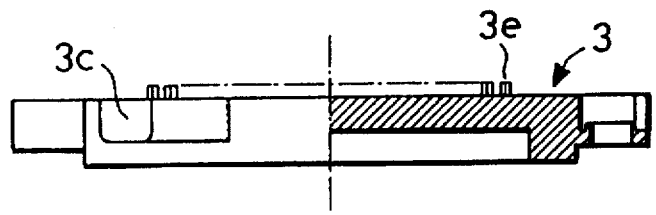
FIG. 11B is a sectional view taken along the line XI—XI of FIG. 11A.
Figure 11C:
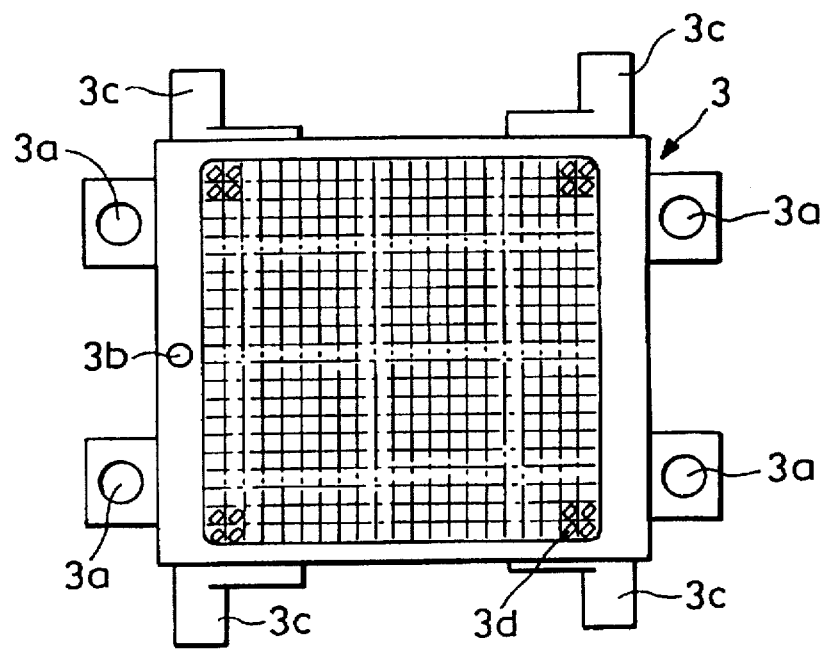
FIG. 11C is a bottom plan view of the slide plate shown in FIG. 11A.
Figure 12A:
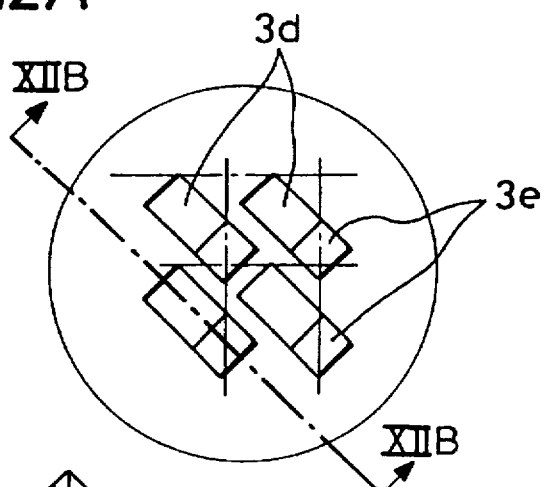
FIG. 12A is an enlarged view of the circled part indicated by the arrow B of FIG. 11A.
Figure 12B:
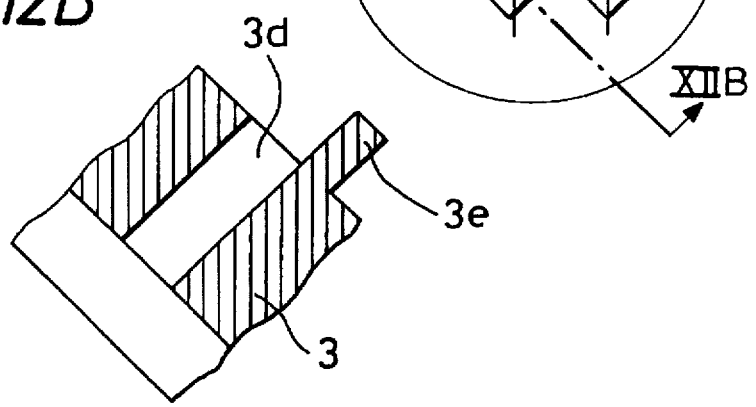
FIG. 12B is a sectional view taken along the line XII—XII of FIG. 12A.

The locate board 2 is illustrated in detail in FIGS. 10A–10C. On the locate board 2, there are formed four elastic hook portions 2a protruding upward under the socket body 1 to be engaged with the hook portions 1d as shown in FIG. 3 and FIG. 6. On the bottom surface of the locate board 2, there are formed reference pins 2b to be used for locating the IC socket on the printed circuit board, and eight legs 2c for keeping a predetermined space between the locate board 2 and the printed circuit board. Furthermore, a plurality of holes 2d are formed in the locate board 2 to make the connecting terminals of the contact pins 13 to pass therethrough. Function of the locate board is well known thus will not be specifically explained.

Next, the slide plate 3 is described using FIG. 11A through FIG. 12B. The slide plate 3 forms four through holes 3a to be fitted on the reference pins 4, as well as a hole 3b which is to be fitted on the pin 1f of the socket body 1 for the purpose of precluding wrong orientation of the slide plate 3 in reference to the socket body 1. On the slide plate 3, there are formed two projecting portions 3c arranged on each of the top side and the bottom side of FIG. 11A. With respect to the "top-side" two projecting portions 3c, the left one is formed longer than the right one, while with respect to the "bottom-side" two projecting portions 3c, the right one is formed longer than the left one. These projecting portions 3c are configured to abut on the slide bars 9 as shown in FIG. 3. Also, a plurality of holes 3d are formed in the slide plate 3 to make the contact pins 13 to pass therethrough. As apparently seen in FIG. 12B, on an upper surface of the slide plate 3, protrusions 3e forms by the holes 3d. Furthermore, the holes 3d are uniquely shaped inside, which will be described later.

Figure 14A:
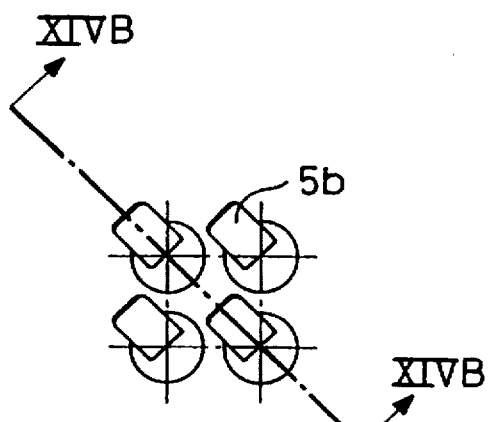
FIG. 14A is an enlarged view of the circled part indicated by the arrow C of FIG. 13A.
Figure 14B:
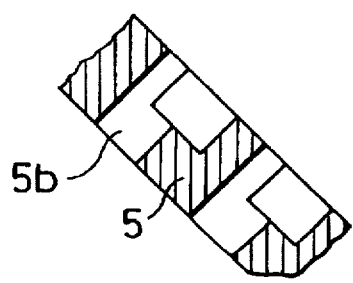
FIG. 14B is a sectional view taken along the line XIV—XIV of FIG. 14A.
Figure 13A:
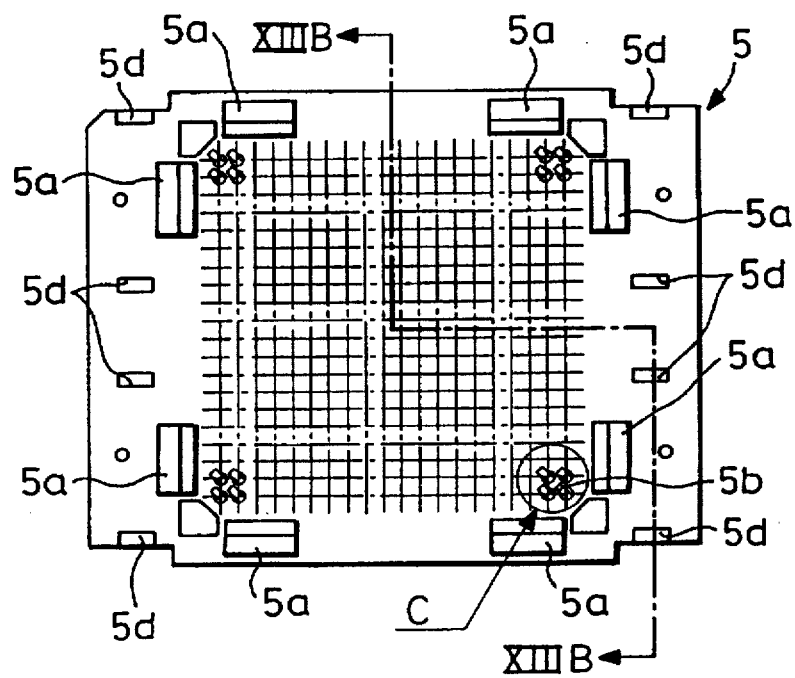
FIG. 13A is a plan view of a top plate incorporated into the IC socket shown in FIG. 2.
Figure 13B:
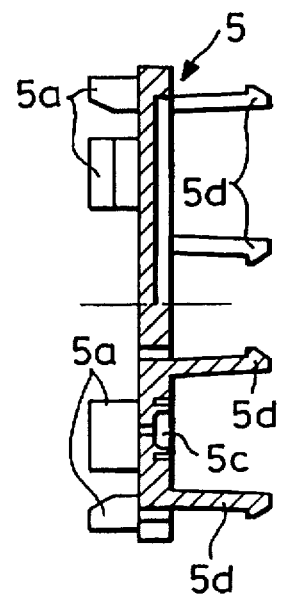
FIG. 13B is a sectional view taken along the line XIII—XIII of FIG. 13A.
Figure 13C:
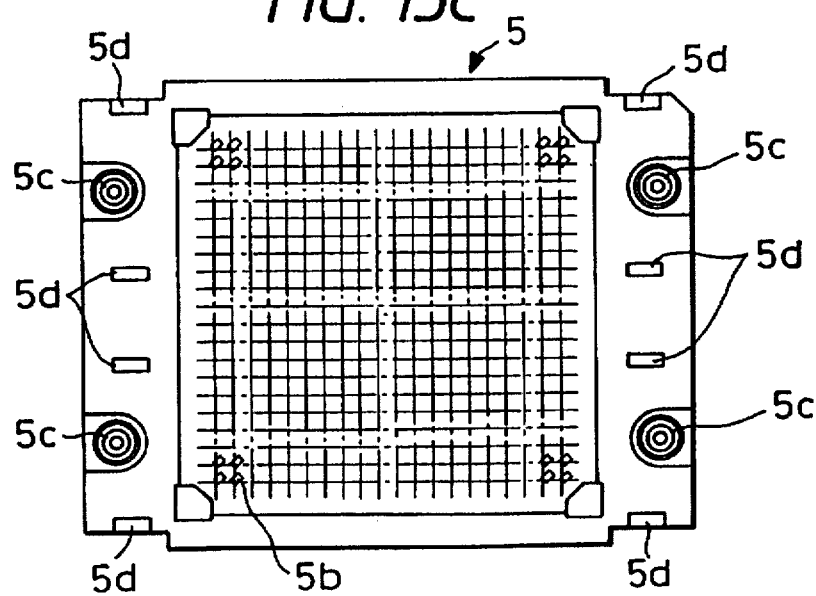
FIG. 13C is a bottom plan view of the top plate shown in FIG. 13A.

Next, the top plate 5 is described using FIG. 13A through FIG. 14B. On the upper surface of the top plate 5, there are formed the above-mentioned eight guides 5a having the inclined faces for regulating position of the BGA device. On an lower surface of the top plate 5, there are formed the above-mentioned four holes 5c, in each of which the other end of each reference pin a is inserted. Respective ends of the coil spring 6 wound around each reference pin 4 are received on the hole 5c and a substantially circular groove formed on an inside surface, which forms the hole 3a, of the slide plate 3. Also, the top plate 5 is mounted to the socket body 1 with engagement of eight elastic hook portions 5d formed on the lower surface of the top plate 5 with the hook portions 1e of the socket body 1. Consequently, in the state shown in FIGS. 3, 4, elastic force of the coil springs 6 effects only downward movement of the slide plate 3. Furthermore, as shown in FIGS. 14A, 14B, each of a plurality of holes 5b through the top plate 5 is shaped as combination of a region having substantially square sectional shape to accommodate the tip of the contact pin 13 and a region having circular sectional shape to accommodate the solder ball B of the BGA device.

Figure 15A:
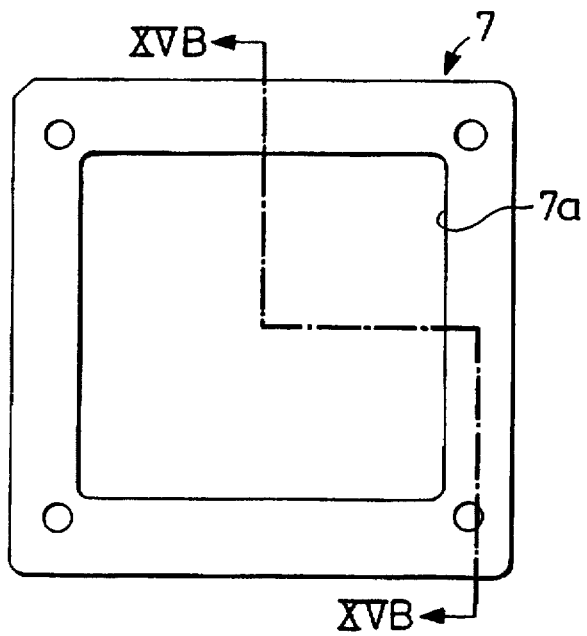
FIG. 15A is a plan view of a cover incorporated into the IC socket shown in FIG. 2.
Figure 15B:
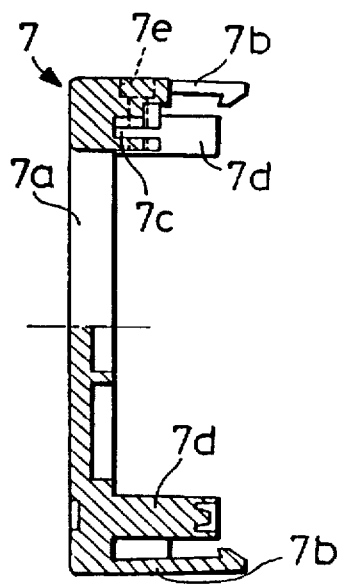
FIG. 15B is a sectional view taken along the line XV—XV of FIG. 15A.
Figure 15C:
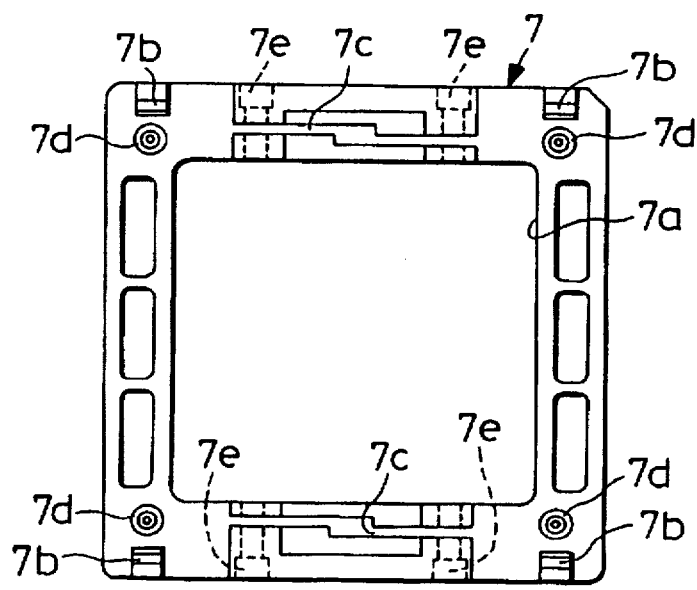
FIG. 15C is a bottom plan view of the cover shown in FIG. 15A.

The cover 7, which is arranged over the top plate 5 as shown in FIG. 3, is described using FIGS. 15A–15C. In the central region of the cover 7, there is formed the above-mentioned opening 7a required for loading and unloading of the BGA device. In the corner regions of the cover 7, the four elastic hook portions 7b are formed to be engaged with the hook portions 1a of the socket body 1. Formed in the corner regions also are four shaft portions 7d to be fitted, in slidable manner in their axial directions, in the holes 1b of the socket body 1. In each hole 1b, the coil spring 8 also is accommodated as shown in FIG. 4, with one end of it being fitted in a groove which is formed on an end face of the shaft portion 7d as having a substantially circular sectional shape. As shown in FIG. 15C, the slits 7c are formed only on two mutually opposite sides of the cover 7, and are shaped not along simple straight lines. This is because the two slide bars 9 are to be arranged in X shape for each side, as described before. For similar reason, the projecting portions 3c formed on the slide plate 3 differ in length between the right and left ones. Also, at four positions in side walls of the cover 7, there are formed holes 7e, into which the pins 10 (see FIG. 3) for pivotably mounting the slide bars 9 are to be thrust.

Figure 19:
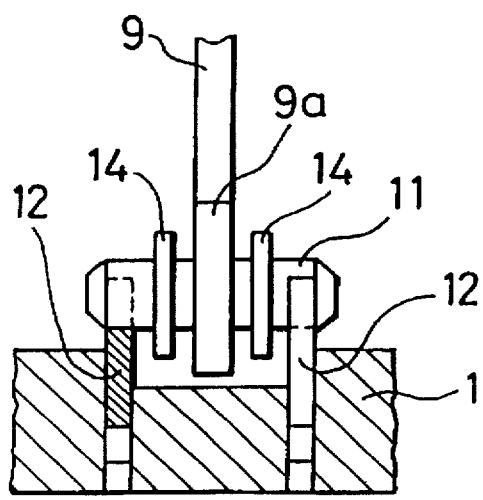
FIG. 19 is a sectional view of one part of FIG. 16.

Next, structure allowing the slide plate 3 to be vertically displaced via the slide bars 9 is detailed using FIG. 16 through FIG. 19. Thrust into the eight slots 1i of the socket body 1 respectively are base sections 12a of the slide support members 12. The slide support members 12 are stamped out of a plate material to be uniformly shaped, but are thrust into the slots 1i as differently oriented corresponding to the positions of the slots 1i as shown in the drawings. The slide support members 12 have concave portions 12b formed for sliding the shafts 11 thereon. Although a pair of slide support members 12 are configured to receive one shaft 11 as shown in FIG. 19, this receiving function is allowed to be executed by a single member whose sectional shape assumes a letter U or H as it is thrust into the socket body 1. Also, the concave portions 12b may be replaced by slots in which the shafts 11 are to be inserted. As stated above, one end region of each slide bar 9 is pivotably mounted on the thrust pin 10, while the other end region is mounted on the shaft 11 along with known snap rings 14 such as E rings which preclude the shaft 11 from coming off the slide bar 9. In FIG. 19, spaces between the shaft 11 and the two snap rings 14 are exaggeratedly drawn for convenience of better understanding of the structure. According to the embodiment, the shaft 11 is rotatably mounted relative to the slide bar 9 to be made not only slide but also roll on the faces forming the concave portions 12b of the slide support members 12 for the purpose of facilitating the movement along the concave portions 12b as well as reducing abrasion caused by the movement. If a highly abrasion-resistant material is applied, however, the shaft 11 is allowed to be integrally constructed with the slide bar 9. Additionally, in the above-mentioned other end regions of the slide bars 9, there are formed the pushing portions 9a to slidingly abut on the projecting portions 3c of the slide plate 3.

Figure 20A:
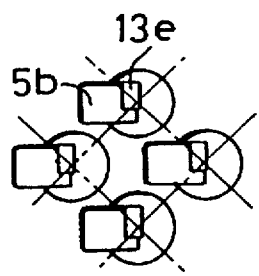
FIG. 20A is a plan view illustrating positions of contact pins, which are incorporated into the IC socket shown in FIG. 2, in holes formed in the top plate.
Figure 25A:
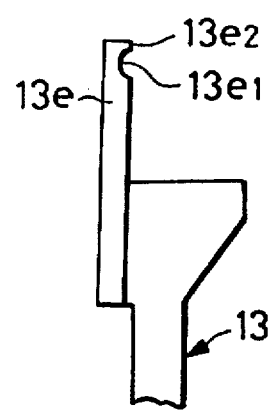
FIGS. 25A, 25B are a side view and an oblique view respectively, illustrating the shape in detail of the tip portion of the contact pin.
Figure 25B:
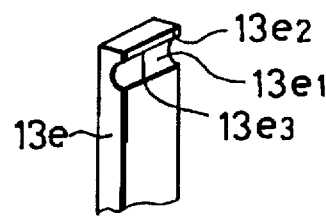

Lastly, shape of the contact pins 13 according to the embodiment and structure directly relating to the contact pins 13 are described in detail using FIG. 20A through FIG. 25B. The contact pins 13 are stamped out of a plate material such as beryllium bronze by a press machine and undergo a bending process. As shown in FIGS. 20A, 20B, 20C, base sections 13a of the contact pins 13 are thrust into the holes 1h (see FIG. 9B) of the socket body 1, while the connecting terminals 13b are loosely fitted in the holes 2d of the locate board 2. On an upper side of the base section 13a, each contact pin 13 has elasticity to be bendable in right-left directions of FIG. 20B as well as right-left directions of FIG. 20C, and forms two bevel sections 13c, 13d which face respective directions mutually shifted by 90° and, at the end of the contact pin, a contact section 13e which is bent substantially by 90° with respect to the bevel section 13d. As shown in FIGS. 25A, 25B, close to the tip of the contact section 13e, an edge 13e3 is formed between a concavity 13e1 and a rectangular face 13e2. The bevel section 13c is positioned mostly inside the hole 3d (see FIGS. 12A, 12B) of the slide plate 3 so that a step portion 3f formed inside the hole 3d is allowed to push it to bend the contact pin 13.

Figure 20B:
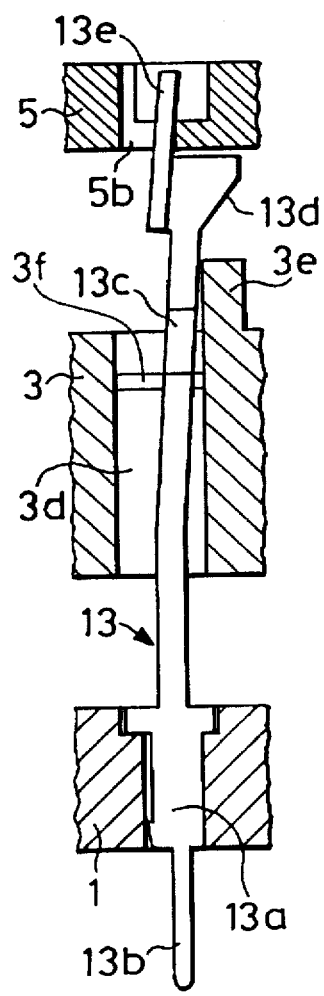
FIG. 20B shows a side view of the contact pin in the state shown in FIG. 20A combined with a sectional view of members associated with the contact pin.
Figure 20C:
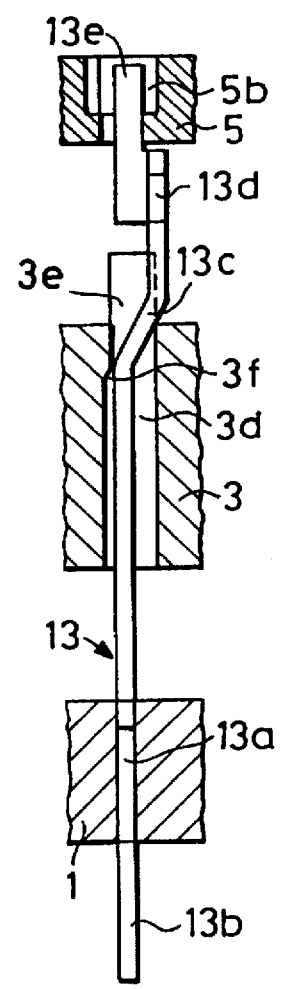
FIG. 20C is a right-side view of FIG. 20B.

FIG. 20C illustrates a state where the contact pin 13 is kept bent in the rightward direction of the figure by the step portion 3f. The bevel section 13d is positioned between the slide plate 3 and the top plate 5 so that the protrusion 3e forming by the hole 3d of the slide plate 3 is allowed to bend the contact pin 13 in the leftward direction of FIG. 20B.

Figure 16:
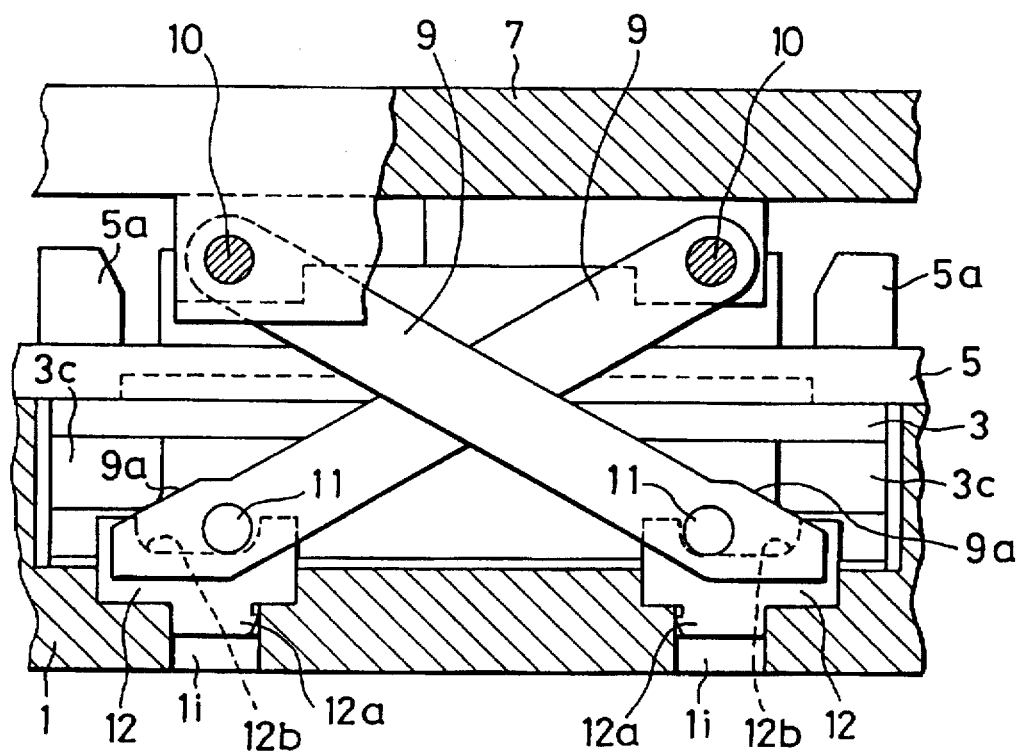
FIG. 16 is a sectional view of the main part of the IC socket shown in FIG. 2, illustrating a state where the cover is positioned at an upper limit position.
Figure 17:
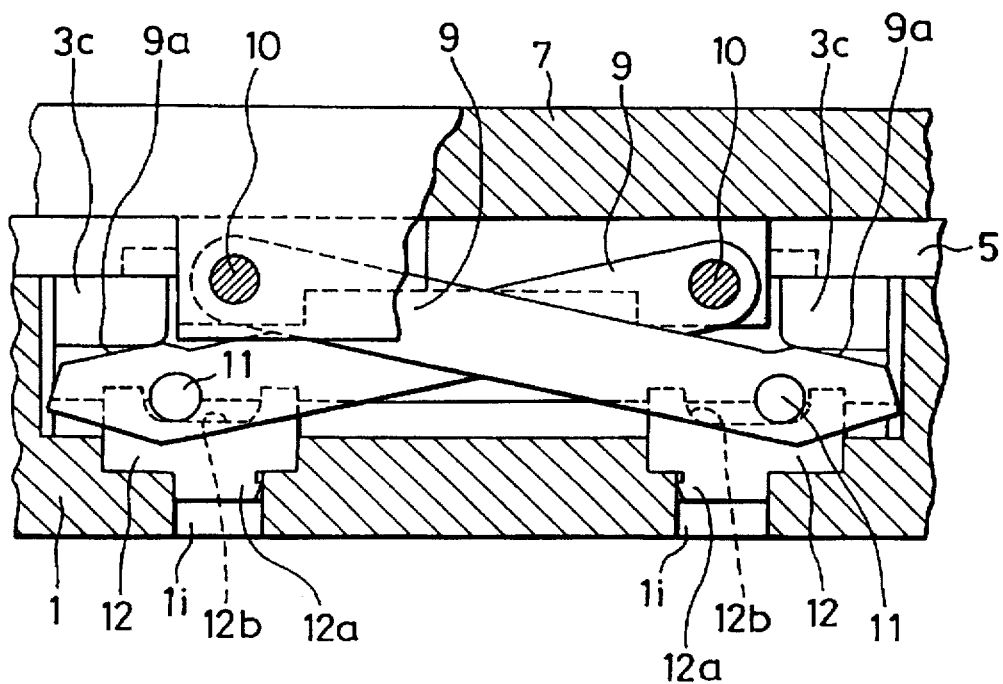
FIG. 17 is a sectional view of the main part of the IC socket shown in FIG. 2, illustrating a state where the cover is positioned at a lower limit position.
Figure 18:
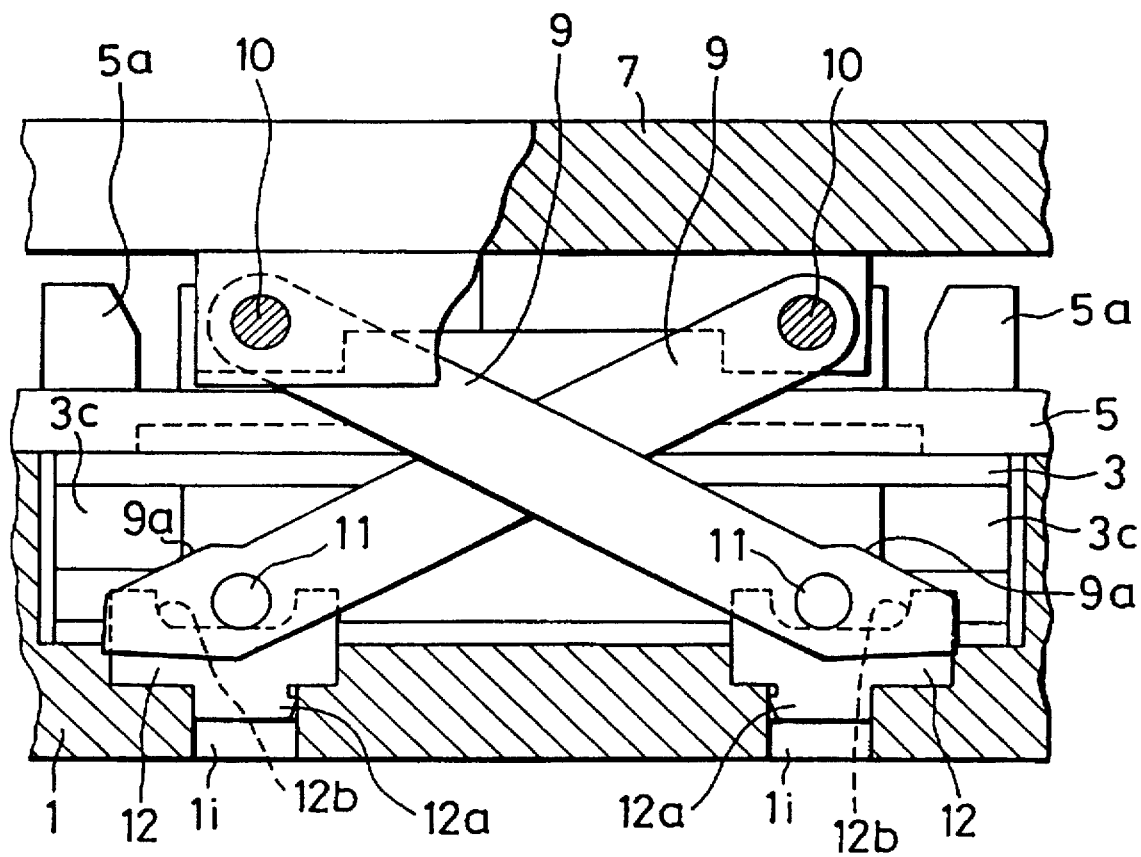
FIG. 18 is a sectional view of the main part of the IC socket shown in FIG. 2, illustrating a state where the cover is on the way back from the lower limit position to the upper limit position.

Next, description will be made on the loading/unloading operation of the BGA device. FIG. 3 and FIG. 16 show the initial position, i.e. the state before the loading of the BGA device, of the IC socket of the embodiment. In this state, the contact pins 13 posture as shown in FIGS. 20A–20C. Firstly, from the state shown in FIG. 16, a certain mechanism starts pushing down the cover 7 against force from the coil springs 8 (see FIG. 4), whereby the X shape of the two slide bars 9 opens rightward and leftward at the bottom according as the shafts 11 move on along the faces forming the concave portions 12b of the slide support members 12.

This movement of the shafts 11 causes the pushing portions 9a to push up the slide plate 3 against the coil springs 6 (see FIG. 4) via the projecting portions 3c. Such a function could be performed with an alternative structure in which slots are provided as the pushing portions 9a and thin pins formed on the projecting portions 3c are fitted in these slots. As the slide plate B is shifted upward from the state shown in FIGS. 20B, 20C, the contact pins 13 are bent in the leftward direction of FIG. 20C in accordance with their own elastic force to move their contact sections 13e in the leftward direction of FIG. 20C also because the step portions 3f in the holes 3d withdraw upward from the point of abutting on the bevel sections 13c. FIG. 18 and FIGS. 21A–21C show the state where this movement of the contact pins 13 is completed.

Figure 21A:
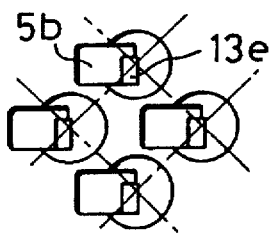
FIG. 21A is a plan view illustrating positions of the contact pins in the holes of the top plate in a state during pushing-down operation of the cover member.
Figure 21B:
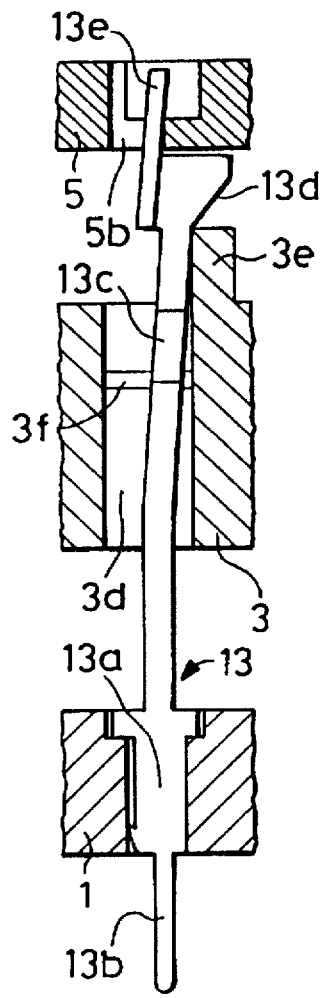
FIG. 21B is a side view of the contact pin in the state shown in FIG. 21A combined with a sectional view of the members associated with the contact pin.
Figure 21C:
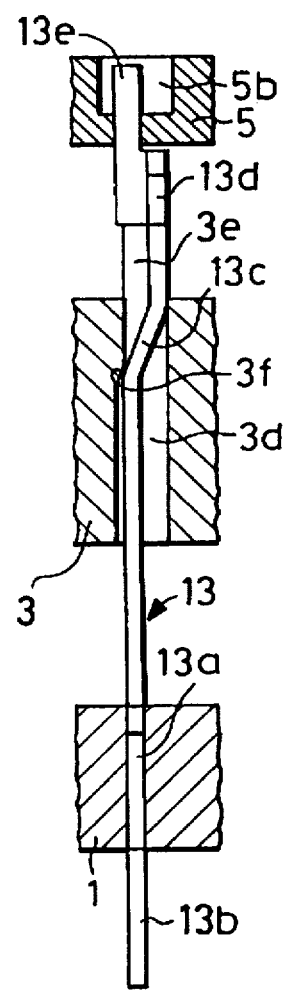
FIG. 21C is a right-side view of FIG. 21B.

As the cover 7 is further pushed down, the protrusions 3e of the slide plate 3 push the bevel sections 13d, whereby the contact pins 13 are bent in the leftward direction of FIG. 21B against their own elastic force to move their contact sections 13e in the leftward direction of FIG. 21B also. FIG. 17 and FIGS. 22A–22C show the state where this movement is completed as any further downward movement of the cover 7 is intercepted by the socket body 1 or the top plate 5.

In the configuration according to this embodiment, resistance is considerably evened throughout the pushing-down operation of the cover 7 described above, thus resistance against the mechanism at the last stage of the pushing-down operation can be reduced. As the cover 7 is pushed down from the state shown in FIG. 16, the coil springs 6 and 8 are further stressed to preserve stronger forces. At the last stage of the pushing-down operation, the elastic force of the contact pins 13 also is added in the resistance. The resultant resistance composed of these forces increases as the pushing down operation proceeds, where the elastic forces of the coil springs 6 and the contact pins 13 are applied to the pushing portions 9a of the slide bars 9 in a vertical direction via the projecting portions 3c of the slide plate 3.

On the other hand, as the pushing-down operation of the cover 7 proceeds, end faces of the pushing portions 9a of the slide bars 9 make a smaller angle with the socket body 1 to nearly assume a horizontal attitude. Therefore, out of the force in the vertical direction derived from the coil springs 6 etc., components which urge the shafts 11 inwardly to resultantly urge the cover 7 upwardly are diminished. Also, an imaginary line drawn from a locus at which the pushing portion 9a of each slide bar 9 meets the projecting portion 3c to a locus of axis of the corresponding shaft 11 is gradually turned to be vertical as the pushing-down operation of the cover 7 proceeds. This means that this line moves to coincide with a line of action of the forces applied to the pushing portion 9a of the slide bar 9. Therefore, in the configuration according to this embodiment, increase in resistance caused by the elastic force of the coil springs and the elastic force of the contact pins 13 to act against the pushing-down operation of the cover 7 is moderated.

Figure 22A:
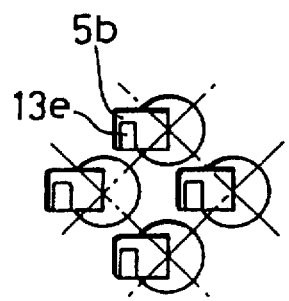
FIG. 22A is a plan view illustrating positions of the contact pins in the holes of the top plate in the state where the cover member is fully pushed down.
Figure 22B:
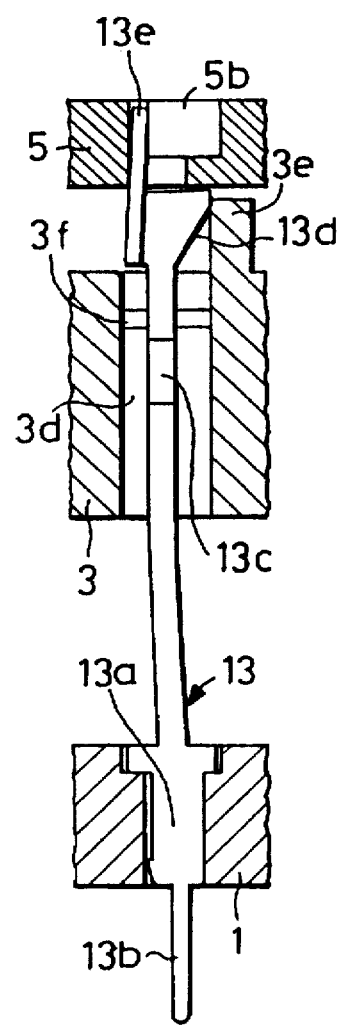
FIG. 22B is a side view of the contact pin in the state shown in FIG. 22A combined with a sectional view of the members associated with the contact pin.
Figure 22C:
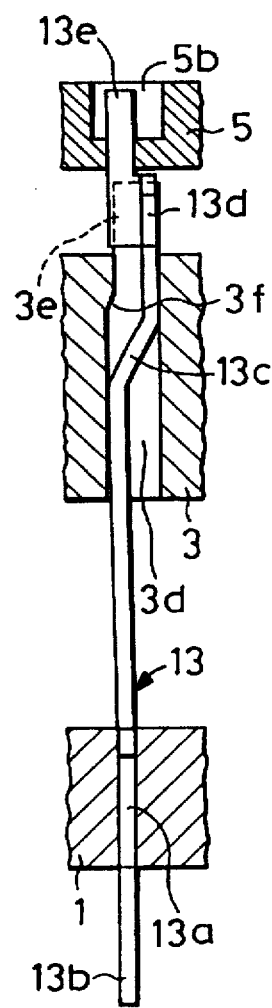
FIG. 22C is a right-side view of FIG. 22B.

The BGA device is inserted in the opening 7a to be placed upon the top plate 5 in the state where the cover 7 is completely pushed down to its lower limit position. In this state, the BGA device is allowed to be correctly positioned on the top plate 5 with its solder balls B being inserted into the respective holes 5b without any obstruction, because the contact sections 13e of the contact pins 13 are completely withdrawn from the regions having circular sectional shape of the holes 5b as shown in FIGS. 22A, 22B as well as diameter of these circular regions is larger than the diameter of the solder balls B.

Figure 23A:
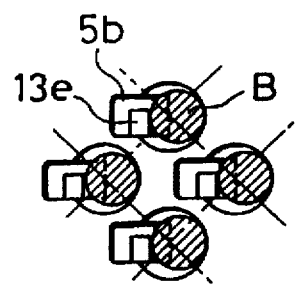
FIG. 23A is a plan view illustrating positions of the contact pins in the holes of the top plate in the state where the cover member is on the way back to the upper limit position with a BGA device being mounted on the top plate.
Figure 23B:
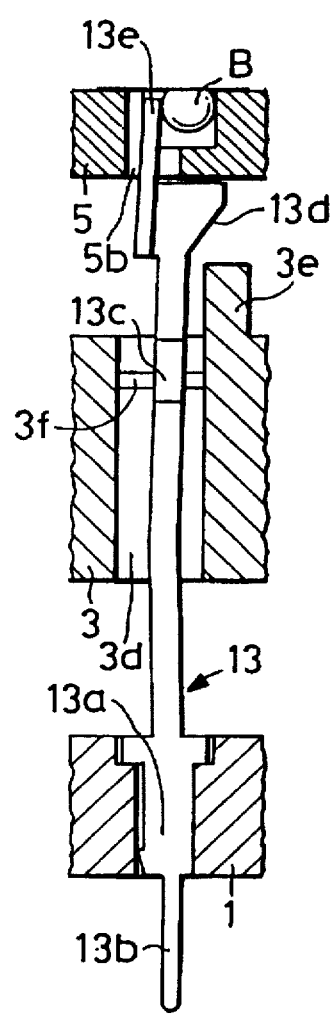
FIG. 23B is a side view of the contact pin in the state shown in FIG. 23A combined with a sectional view of the members associated with the contact pin.

After the BGA device is placed on the top plate 5, the cover 7 is released from the pushing-down force, whereby the cover 7 and the slide plate 5 move upward and downward respectively. In accordance with the descent of the slide plate 3, the protrusions 3e withdraw from the bevel sections 13d of the contact pins 13 and consequently the contact pins 13 are made to perform return movement by their own elastic force. This movement is stopped by the solder balls B when the contact sections 13e abut thereon, with positions of the cover 7, the slide bars 9 and the slide plate 3 being such as shown in FIGS. 18 and 23A–23C. In this state, the contact sections 13e maintain contact with the solder balls B with the edges 13e3 somewhat biting the solder balls B. Moreover, since the contact is made on each solder ball B, as shown in FIG. 23B, at a level higher than a substantially laterally facing zone of the solder ball B, where the horizontal diameter is measured, the BGA device is steadily held at a predetermined position even if force for pressing the BGA device on the top plate 5 is no more applied.

Figure 23C:
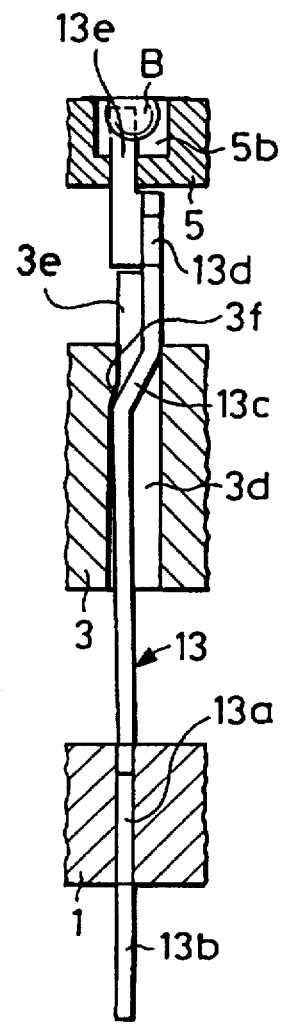
FIG. 23C is a right-side view of FIG. 23B.
Figure 24A:
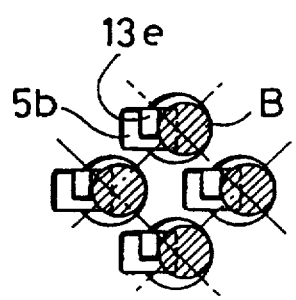
FIG. 24A is a plan view illustrating positions of the contact pins in the holes of the top plate in a state where the BGA device is completely loaded in the IC socket.
Figure 24B:
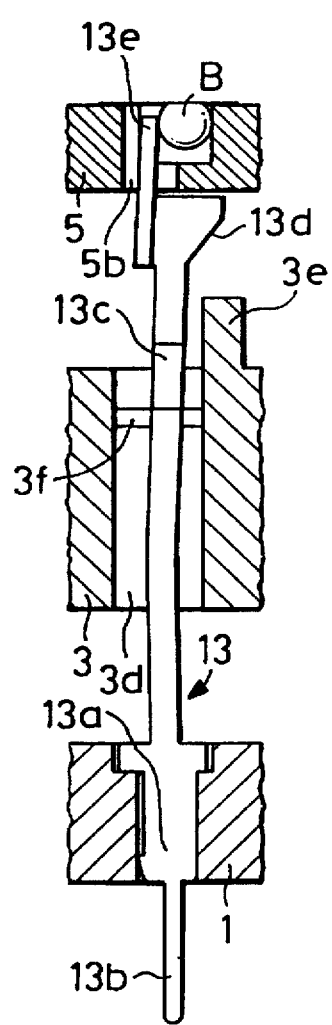
FIG. 24B is a side view of the contact pin in the state shown in FIG. 24A combined with a sectional view of the members associated with the contact pin.
Figure 24C:
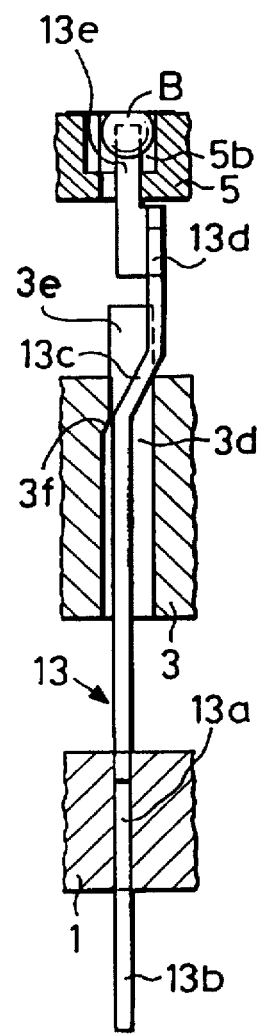
FIG. 24C is a right-side view of FIG. 24B.

As the slide plate 3 further descends from this state, the contact pins 13 are pushed, at the bevel sections 13c, by the step portions 3f to be bent in the rightward direction of FIG. 23C. On this occasion, since the edges 13e3 of the contact sections 13e rather bite the solder balls B, they linearly scrape, though slightly, the solder balls B, whereby materials to impair electrical conduction, e.g. dust and an oxide film, are steadily removed from the surfaces of the solder balls B.

that is, "wiping" is implemented. Also, stability of the contact is enhanced due to concentration of the pressure.

Considering the situation where practically joined to the printed circuit board, the BGA device is required to keep particularly high-level quality with respect to shape of lower hemispherical surfaces of the solder balls B. On the other hand, when the BGA device is inspected using an IC socket, the solder balls B may be damaged as the contact pins are brought into contact with them or perform wiping operation, even in the usual manner. According to the embodiment, such a quality requirement above mentioned is satisfied because the point of contact on each solder ball B with the edge 13e3 of the contact section 13e is located on an upper side of the substantially laterally facing zone.

After the wiping of the solder balls B is done as described above, the loading operation of the BGA device is completed with the hook portions 7b of the cover 7 being engaged with the hook portions 1a of the socket body 1. Position of each member in this state is shown in FIGS. 16 and 24A–24C. After the BGA device is inspected in this state, the sequence of pushing-down and release of the cover 7 is to be repeated for ejecting the BGA device from the IC socket. Since each member acts substantially in the same manner as in the loading operation, detailed description will be omitted.

Although the above-described embodiment arranges two slide bar sets on the cover 7, wherein each of the sets includes two slide bars 9, such a set is allowed to be constructed as a single slide bar. In this case, however, it is preferred that the slide bars on the mutually opposite sides are arranged to intercross between these opposite sides so that movement of the slide plate 3 is stabilized. Also, the slide bars 9 may be arranged on respective four sides of the cover 7. In such an arrangement, it does not matter if each of the sides is provided with a single slide bar 9. Furthermore, although the IC socket of the embodiment is constructed so that the top plate 5 having the plurality of holes 5b formed therein acts as stage means for the BGA device, another configuration in which only a part, such as the margin, of the BGA device is supported by a part of the socket body 1 is applicable in case mutual contact of the contact sections 13a of the contact pins 13 is unlikely.

Furthermore, while the embodiment is described using the BGA device as an example of the object to be inspected, the present invention is applicable to every type of IC socket which is intended to actuate contact pins via vertical displacement of the slide plate 3 in accordance with vertical movement of the cover 7. The present invention is also applicable to an IC device which does not execute the above-mentioned "wiping". If the present invention is to be applied to the IC socket having no wiping function, the slide plate 3 may be adopted as stage means for directly mounting the IC device thereon.

What is claimed is:

1. An IC socket comprising:
  a socket body;
  a cover member assuming a square shape with an opening formed therein as an entrance for an IC device, being mounted to said socket body to be vertically displaceable relative thereto, and being urged upward;
  a stage member mounted to said socket body for mounting the IC device thereon;
  a slide plate having force receiving portions, being mounted to said socket body to be vertically displaceable relative thereto for actuating a plurality of contact pins, and being urged downward; and
  slide bar sets each of which is arranged on each of mutually opposite sides of the square shape and includes at least one slide bar, each of the slide bars being pivotably mounted, in one end region thereof, to said cover member and forming a pushing portion, in another end region thereof, engageable with each of said force receiving portions of said slide plate;
  wherein the another end region of each of the slide bars is horizontally shifted along a guide portion arranged on said socket body in accordance with vertical displacement of said cover member to displace said slide plate vertically via the pushing portion.

2. An IC socket according to claim 1, wherein said stage means has a plurality of holes formed therein for inserting lead terminals of the IC device therein.

3. An IC socket according to claim 1 or 2, wherein said stage means is formed on said socket body.

4. An IC socket according to claim 1 or 2, wherein said stage means is integrally formed with said slide plate.

5. An IC socket according to claim 1, wherein the another end region of each of the slide bar is provided with a shaft which abuts on said guide portion.

6. An IC socket according to claim 1, wherein an end face of the another end region of each of the slide bars is formed as said pushing portion.

7. An IC socket according to claim 1, wherein each of said slide bar sets is composed of a single slide bar, the slide bars provided on the mutually opposite sides of the square shape being arranged to form an X shape between the mutually opposite sides.

8. An IC socket according to claim 1, wherein each of said slide bar sets provided on the mutually opposite sides of the square shape includes a pair of slide bars arranged to form an X shape.

* * * * *